(12) United States Patent
Raschilla et al.

(10) Patent No.: US 9,504,172 B2
(45) Date of Patent: Nov. 22, 2016

(54) ELECTRONIC ASSEMBLY HAVING A CIRCUIT BOARD WITH A SHOCK ABSORBER DEVICE

(71) Applicant: DELPHI TECHNOLOGIES, INC., Troy, MI (US)

(72) Inventors: Anthony Raschilla, Girard, OH (US); Steven William Marzo, Cortland, OH (US)

(73) Assignee: Delphi Technologies, Inc., Troy, MI (US)

( * ) Notice: Subject to any disclaimer, the term of this patent is extended or adjusted under 35 U.S.C. 154(b) by 46 days.

(21) Appl. No.: 14/578,646

(22) Filed: Dec. 22, 2014

(65) Prior Publication Data

US 2016/0183394 A1  Jun. 23, 2016

(51) Int. Cl.

| H05K 7/00 | (2006.01) |
|---|---|
| H05K 5/02 | (2006.01) |
| H05K 5/00 | (2006.01) |
| H05K 7/14 | (2006.01) |
| G11B 33/08 | (2006.01) |
| F16F 15/00 | (2006.01) |
| H04M 1/18 | (2006.01) |

(52) U.S. Cl.
CPC .......... *H05K 5/0217* (2013.01); *H05K 5/0008* (2013.01); *H05K 5/0056* (2013.01); *H05K 7/142* (2013.01); *F16F 15/00* (2013.01); *G11B 33/08* (2013.01); *H04M 1/185* (2013.01)

(58) Field of Classification Search
CPC ... G11B 33/08; G11B 33/14; G11B 33/1466; H05K 5/061; H05K 9/0015; H05K 5/0217; H05K 5/0056; H05K 7/142; H05K 5/0008; F16F 1/36; F16F 1/3605; F16F 15/00; F16F 15/08; F16F 7/108; H04M 1/185; H02B 1/28

USPC .......... 361/679.34, 748, 752, 802, 804, 807; 174/544; 360/97.19; 455/575.1; 267/141, 292, 294; 248/560, 611, 613, 248/615, 638

See application file for complete search history.

(56) References Cited

U.S. PATENT DOCUMENTS

| 5,223,996 A | * | 6/1993 | Read | G11B 33/1466 |
|---|---|---|---|---|
| | | | | 360/99.18 |
| 5,394,306 A | | 2/1995 | Koenck | |
| 5,450,064 A | * | 9/1995 | Williams, Jr. | G08B 25/016 |
| | | | | 340/574 |

(Continued)

FOREIGN PATENT DOCUMENTS

| DE | 102011054231 A1 | 4/2013 |
|---|---|---|
| EP | 2693314 A1 | 2/2014 |

*Primary Examiner* — James Wu
(74) *Attorney, Agent, or Firm* — Robert J. Myers

(57) ABSTRACT

An electronic assembly including a printed circuit board (PCB), a housing, and a shock absorbing device that is intermediate the printed circuit board and the housing. The shock absorbing device is formed of an insulative and compliant material, such as a thermoplastic elastomer material. The side walls of the shock absorbing device defines a groove surrounds and at least partially encloses the edges of the printed circuit board. The shock absorbing device defines an aperture through which a fastener is configured to pass to secure the shock absorbing device to the housing and thus securing the printed circuit board within the housing. The shock absorbing device is intermediate the fastener and the printed circuit board so that there is no direct contact between the fastener and the printed circuit board which could transmit impact shock directly from the housing to the printed circuit board.

7 Claims, 3 Drawing Sheets

(56) References Cited

U.S. PATENT DOCUMENTS

| | | | | |
|---|---|---|---|---|
| 5,524,908 A * | 6/1996 | Reis | H05K 9/0015 174/358 |
| 5,845,803 A * | 12/1998 | Saito | H05K 5/061 220/222 |
| 6,454,250 B1 * | 9/2002 | Ribeiro | F16F 1/368 248/615 |
| 7,242,552 B2 * | 7/2007 | Kudo | G11B 33/08 360/97.12 |
| 8,655,422 B2 * | 2/2014 | Stiehl | B29C 45/1676 361/730 |
| 8,755,192 B1 | 6/2014 | Schrempp et al. | |
| 2005/0236171 A1 * | 10/2005 | Garcia | H05K 9/0032 174/387 |
| 2009/0255726 A1 * | 10/2009 | Yang | H05K 7/142 174/544 |
| 2010/0048249 A1 | 2/2010 | Furuta et al. | |
| 2010/0213649 A1 | 8/2010 | Lee et al. | |

* cited by examiner

ELECTRONIC ASSEMBLY HAVING A CIRCUIT BOARD WITH A SHOCK ABSORBER DEVICE

TECHNICAL FIELD OF THE INVENTION

The invention relates to electronic assemblies having a circuit board, particularly those including a shock absorber device.

BACKGROUND OF THE INVENTION

In many electronic assemblies that have number of delicate electronic components disposed on a printed circuit board, the printed circuit board is enclosed within a housing and is mounted to the housing by fasteners, e.g. screws.

However, an electronic assembly can be subject to impact during the assembly, packing, and delivering processes, or even when the user is using the electronic device. When the electronic assembly is subjected to impact generated forces, the housing of the electronic assembly may transmit the forces to the printed circuit board, hereinafter referred to be the commonly used acronym PCB. Alternatively, due to the impact forces, the housing may be distorted or the PCB may be shifted relative to the housing. Because the PCB is directly fixed to the housing, the stress generated from these impact forces and distortions of the housing are directly transferred to the PCB, resulting in the deformation of the PCB. This deformation of the PCB may damage the electronic components or solder material used to attach the electronic components to the PCB may crack or fracture causing a failure of the electronic assembly.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF THE INVENTION

In accordance with an embodiment of the invention, an electronic assembly is provided. The electronic assembly includes a housing and a printed circuit board (PCB) disposed within the housing. The PCB has a first major surface, a second major surface opposite the first major surface, and a plurality of peripheral minor edges substantially perpendicular to the first and second major surfaces. The electronic assembly also includes at least one fastener that is configured to secure the PCB within the housing. The electronic assembly further contains a shock absorbing device that is formed of an insulative and compliant material. The shock absorbing device surrounds the plurality of peripheral minor edges of the PCB.

The PCB may define a generally rectangular shape. The shock absorbing device may define a groove that is configured to receive and enclose at least a portion of the plurality of peripheral minor edges of the PCB. The shock absorbing device may define a side wall that is configured to surround at least a portion of the plurality of peripheral minor edges of the PCB. The shock absorbing device may define a first lip that is substantially perpendicular to the side wall and is configured to surround at least a portion of the first major surface and may define a second lip that is also substantially perpendicular to the side wall and is configured to surround at least a portion of the second major surface. The first and second lips may define a groove that is configured to receive and enclose at least a portion of the first major surface and the second major surface.

The PCB may define a central mounting hole located in a central portion of the PCB. The shock absorbing device may additionally include a shouldered bushing that is generally coaxial with the central mounting hole and in contact with the first major surface. The shouldered bushing is at least partially disposed within the central mounting hole and is integrally formed with the shock absorbing device. The shock absorbing device may further include a perforated disk that is tethered to the shock absorbing device and is integrally formed with the shock absorbing device. When the PCB is secured within the housing, the shouldered bushing is intermediate the first major surface of the PCB and the housing and the perforated disk is intermediate the second major surface of the PCB and the fastener.

The shock absorbing device may be formed of a thermoplastic elastomer material, such as a thermoplastic vulcanizates material or equivalent.

In accordance with another embodiment, another electronic assembly is provided. The electronic assembly includes a housing and a PCB defining a first generally rectangular shape having four major PCB corners that define four PCB mounting features. The PCB is disposed within the housing. The electronic assembly further includes a shock absorbing device that defines a second generally rectangular shape. The shock absorbing device has four major shock absorbing device corners. Each of the shock absorbing device corners define a groove that is configured to enclose one of the PCB corners and surround one of the PCB mounting features. Each of the shock absorbing device corners defines a shock absorbing device mounting hole that is coaxial with the PCB mounting feature. The electronic assembly additionally includes a plurality of fasteners. One fastener in the plurality of fasteners is disposed within each PCB mounting feature and shock absorbing device mounting hole. The plurality of fasteners are secured to the housing such that the shock absorbing device is intermediate the plurality of fasteners and the housing, thereby securing the PCB to the housing.

The shock absorbing device corners are interconnected by a side wall, a first lip that is substantially perpendicular to the side wall, and a second lip that is also substantially perpendicular to the side wall. The first and second lips are configured to enclose at least a portion of a peripheral minor edge of the PCB.

The PCB may further define a central PCB mounting hole located in a central portion of the PCB. The shock absorbing device may include a shouldered bushing that is coaxial with the central PCB mounting hole and is at least partially disposed within the central PCB mounting hole. The shouldered bushing is integrally formed with the shock absorbing device. The shock absorbing device may further include a perforated disk that is tethered to the shock absorbing device and is integrally formed with the shock absorbing device. The shouldered bushing is intermediate the PCB and the housing and the perforated disk is intermediate the PCB and a fastener of the plurality of fasteners when the PCB is secured within the housing.

The shock absorbing device may be formed of a thermoplastic elastomer material, such as a thermoplastic vulcanizates material or equivalent.

BRIEF DESCRIPTION OF THE SEVERAL VIEWS OF THE DRAWING

The present invention will now be described, by way of example with reference to the accompanying drawings, in which.

DETAILED DESCRIPTION OF THE INVENTION

An electronic assembly that includes a shock absorber device to protect a printed circuit board assembly within the electronic assembly from an impact shock is described herein.

The shock absorber device is to absorb the impact shock forces generated when the electronic assembly is dropped on to the ground and prevent the impact forces generated in the housing that are caused by the drop from being transmitted to the PCB that may cause damage to electronic components on the PCB to or solder joints between these components and the PCB.

A non-limiting example of such an electronic assembly is a portable battery charger that is used on with electrical or hybrid electrical vehicles to recharge the batteries in the vehicle's battery pack. There are many opportunities for the consumer to remove such a portable battery charger from a trunk of a vehicle and drop the portable battery charger so that it strikes the ground causing potentially damaging impact forces. The portable battery charger includes a shock absorber device between a housing and a PCB that is designed is absorb the impact forces and prevent the impact forces from being transmitted through the housing and into the circuit board assembly that could cause damage to electronic components on the PCB to or solder joints between these components and the PCB. The shock absorber device may allow the portable battery charger to be dropped numerous times and dampen the impact forces transmitted to the PCB that may otherwise damage the surface mount components located on the circuit board. The inventors have found that when the shock absorber device is used in the charger it was able to successfully survive multiple drops on to a concrete surface from a height of one (1) meter without any damage to the electronic components or the PCB as opposed to multiple instances of electronic component damage in identical tests of portable battery chargers without a shock absorber device.

Figure 1:
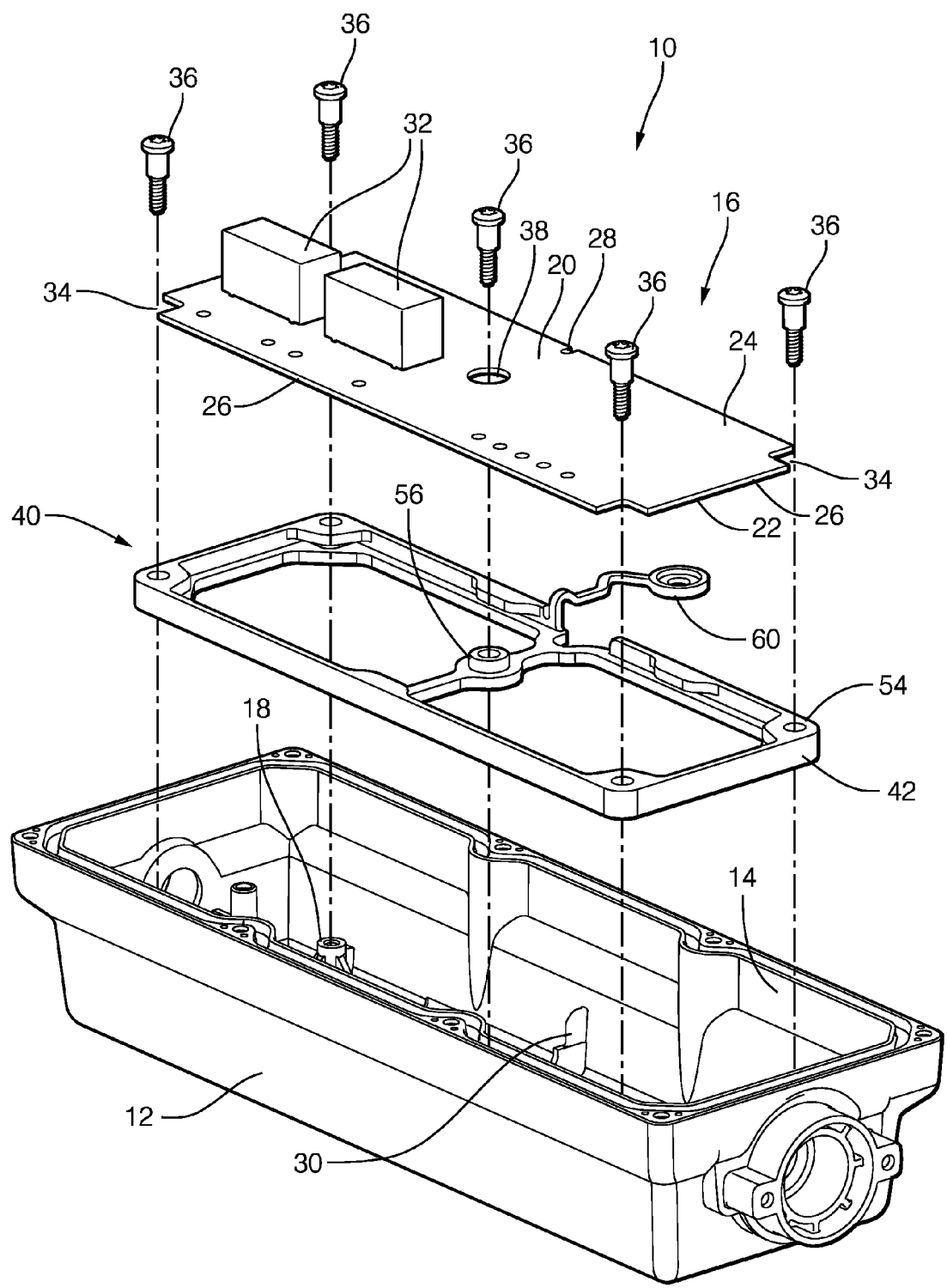
FIG. 1 is an exploded perspective view of an electronic assembly according to one embodiment.

FIG. 1 illustrates a non-limiting example of an embodiment of an electronic assembly, such as a portable battery charger, generally referred to by the reference number 10. As shown in FIG. 1, the electronic assembly 10 includes a housing 12 that may be formed of an electrically non-conducting thermoplastic material, such as glass filled polyamide. The housing 12 may alternatively be formed of an electrically conductive material, such as aluminum or any number of engineering materials that can provide sufficient stiffness and durability as required for the application of the housing 12.

The illustrated housing 12 generally defines an open box shape defining a cavity 14 in which a printed circuit board assembly 16 is disposed. The housing 12 defines a number of mounting bosses 18 configured to secure the printed circuit board assembly 16 within the cavity 14. The electronic assembly 10 also includes a cover (not shown) that is configured to enclose the printed circuit board assembly 16 within the cavity 14 of the housing 12.

The printed circuit board (PCB) assembly 16, generally referred to by the acronym PCB, includes a substrate 20 having a first, or lower, major surface 22, a second, or upper, major surface 24 opposite the lower major surface, and a plurality of peripheral minor edges 26 substantially perpendicular to the lower and upper major surfaces 22, 24, hereinafter referred to as edges 26. As used herein, substantially perpendicular is defined as ±10° of absolutely perpendicular. The substrate 20 has a generally rectangular shape, although the edges 26 of the substrate 20 may define an alignment notch 28 that accommodates an alignment feature 30 defined within the cavity 14 used to align the PCB 16 within the cavity 14. A number of electronic components 32, such as resistors, capacitors, diodes, inductors, transistors, and/or integrated circuits are attached to and interconnected by conductive traces (not shown) printed onto the upper surface 24 and/or lower surface 22 of the substrate 20. The substrate 20 defines a number of mounting features 34 that are used to secure the PCB 16 to the housing 12. As shown in FIG. 1, each corner of the substrate 20 defines mounting features 34 in the form of a cut-out corner of the substrate 20 configured to allow a fastener 36 to pass therethrough to secure fastener 36 to the mounting boss 18 of the housing 12. The fasteners 36 in the illustrated example are threaded fasteners, i.e. screws. However, alternative embodiments may use different types of fasteners, such as push pins, rivets, or snap features. In addition, according to alternative embodiments, the mounting features may comprise one or more corners of the substrate defining a circular hole configured to allow a fastener to pass therethrough.

As shown in FIG. 1, the substrate 20 further defines a central mounting hole 38 located in a central region of the substrate 20, i.e. not adjacent an edge 26 of the substrate 20. The central mounting hole 38 may be used to secure the central portion of the PCB 16 to the housing 12 in order to reduce lateral and longitudinal flexing of the PCB 16.

The substrate 20 may be made from epoxy or polyimide resins. The resin may be reinforced with a woven glass cloth or other matrix such as chopped fibers. Substrates formed of such materials are typically called FR-4 or G-10 type circuit boards. The substrate 20 may alternately be constructed of ceramic or rigid polymer materials. This listing of acceptable substrate materials is not exhaustive and other materials may also be used successfully. The materials and manufacturing techniques used to form circuit board substrates are well known to those skilled in the art.

The electronic assembly 10 further includes a shock absorbing device 40 that is formed of a formed of a dielectric and complaint material, such as a silicone rubber material, an ethylene propylene diene monomer (EPDM) rubber material, or a thermoplastic elastomer (TPE) material, such as SANTOPRENE™ 8221-70 thermoplastic vulcanizates (TPV) material manufactured by the Exxon Mobil Chemical Company of Houston, Tex. The shock absorbing device 40 may be formed in a mold using an injection molding process.

Figure 3:
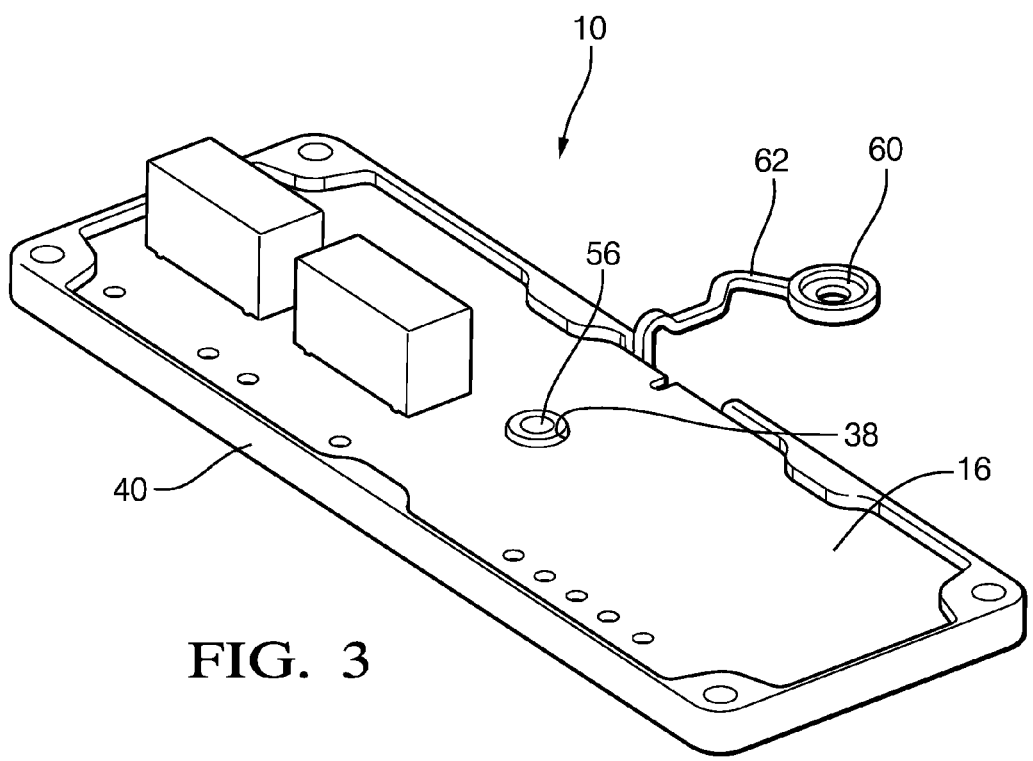
FIG. 3 is an isolated perspective view of the shock absorbing device of FIG. 2 attached to a printed circuit board that is component of the electronic assembly of FIG. 1 according to one embodiment.
Figure 4:
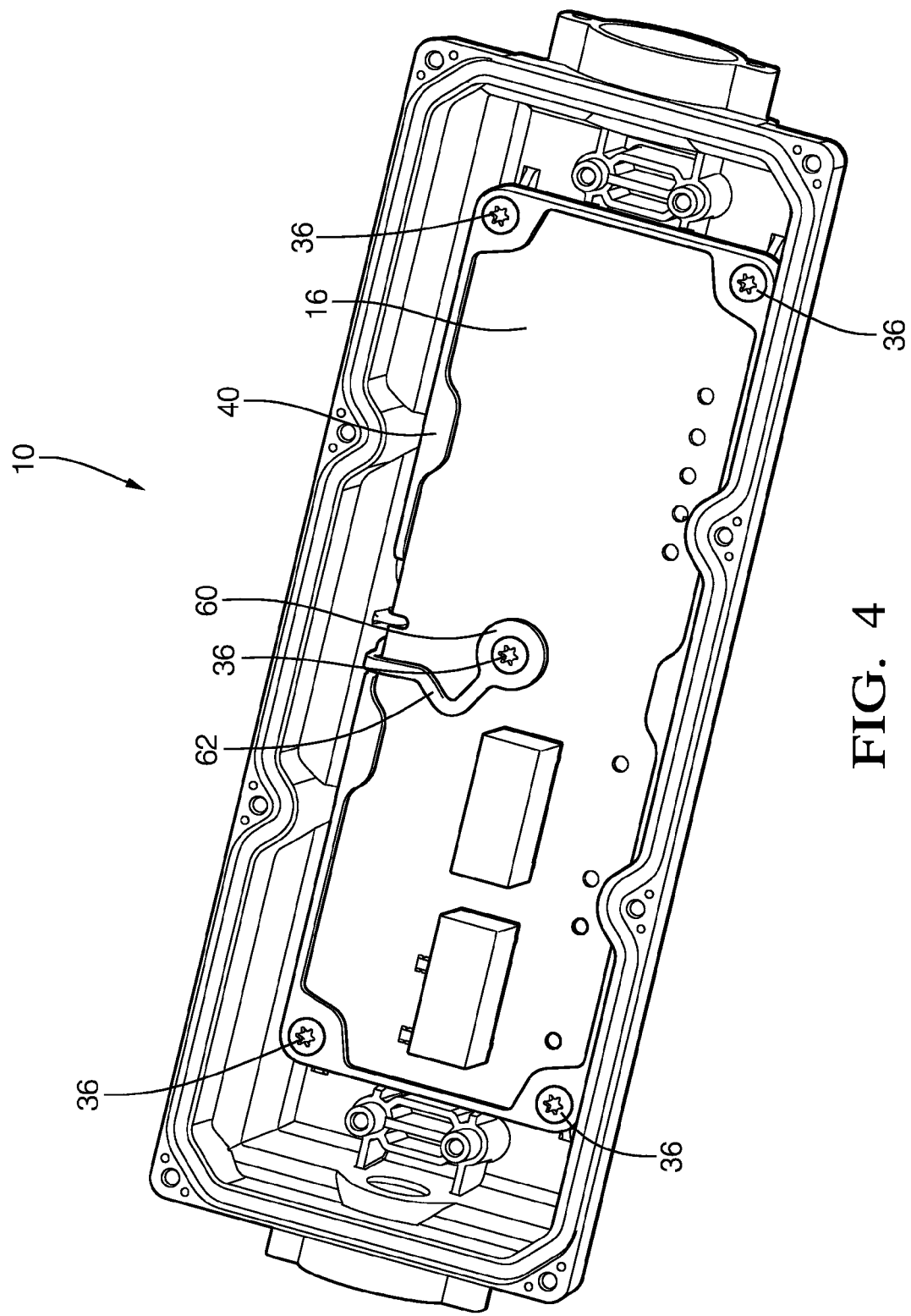
FIG. 4 is a perspective view of the electronic assembly of FIG. 1 is an assembled condition according to one embodiment.

The shock absorbing device 40 defines a generally rectangular shape that is similar to the shape of the substrate 20, but is larger than the substrate 20. The shock absorbing device 40 includes a side wall 42 that surrounds at least a portion of the edges 26 of the substrate 20. As shown in FIGS. 1 and 3, the side walls surround the edges 26 with a small interruption 44 to accommodate the alignment notch 28 in the substrate 20. These side walls define grooves 46 that encase at least a portion of the substrate 20. As used herein, encase is defined to mean that the shock absorbing device 40 surrounds the exposed edges 26. The grooves 46 are formed by a first (lower) lip 48 that projects substantially perpendicularly from the side wall 42 and a second (upper) lip 50 that projects substantially perpendicularly from the side wall 42 and is spaced apart from the lower lip 48. The lower lip 48 contacts the lower surface 22 of the substrate 20 near the edges 26 and the upper lip 50 contacts the upper surface 24 of the substrate 20 near the edges 26 and opposite a contact point of the lower lip 48, thus securing the shock absorbing device 40 to the PCB 16. The lower lip 48 projects from the entire perimeter of the side walls while the upper lip 50 projects from the corners and three short sections of opposing side walls. This configuration of the lower lip 48 and the upper lip 50 provide adequate retention of the shock absorbing device 40 to the PCB 16 while also providing easier assembly of the shock absorbing device 40 to the PCB 16 than a shock absorbing device having an upper lip that also projects from the entire perimeter of the side wall (not shown).

Figure 2:
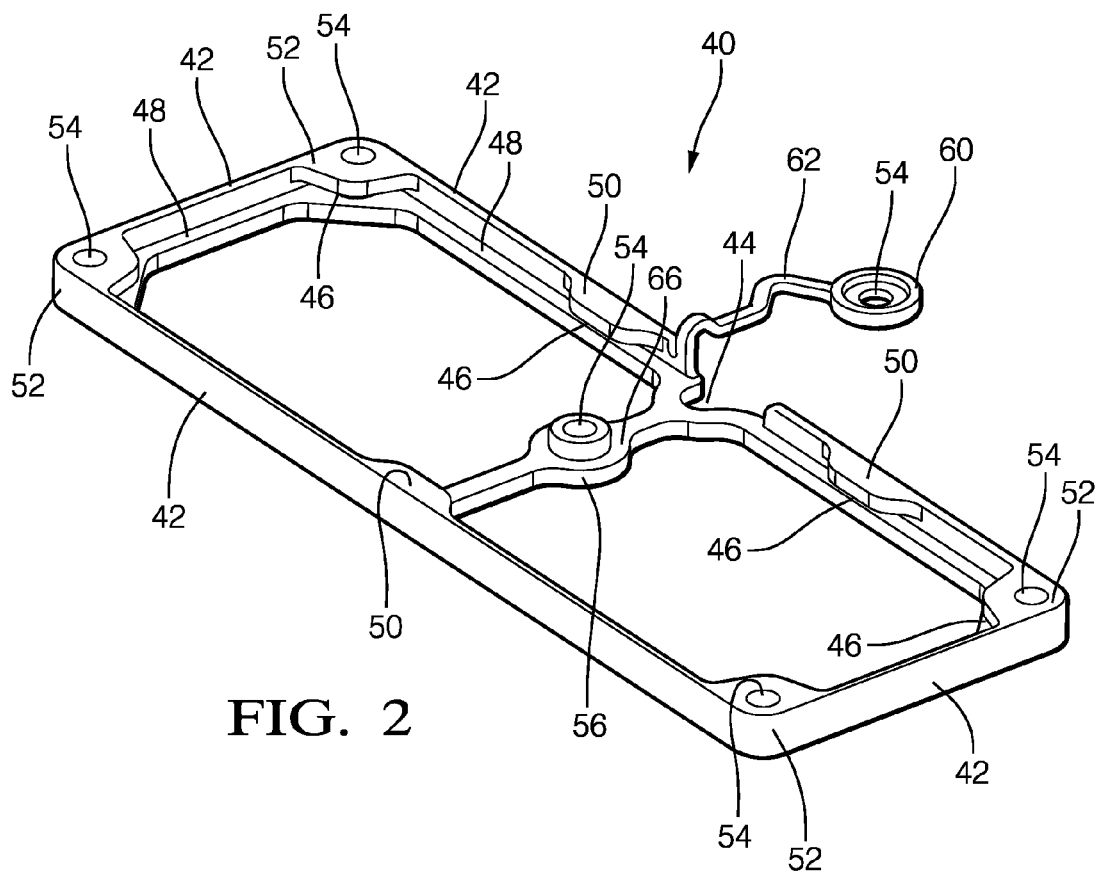
FIG. 2 is an isolated perspective view of a shock absorbing device that is a component of the electronic assembly of FIG. 1 according to one embodiment.

Each corner 52 of the shock absorbing device 40 defines an aperture 54, hereinafter referred to as a mounting hole 54, through which a fastener 36 is configured to pass when the fastener 36 is secured to the mounting boss 18, thereby securing the shock absorbing device 40 to the housing 12 and thus securing the PCB 16 within the housing 12. The shock absorbing device 40 is intermediate each fastener 36 and the PCB 16 so that there is no direct contact between the fastener 36 and the PCB 16 which could transmit impact shock forces directly from the housing 12 to the PCB 16. As shown in FIG. 2, only the upper lip 50 contains a mounting hole. Alternative embodiments may define mounting holes in only the lower lip or in both upper and lower lips of the shock absorbing device.

The shock absorbing device 40 also includes a generally cylindrical shouldered bushing 56 that is configured to be coaxial with the central mounting hole 38 of the PCB 16. The shouldered bushing 56 defines a mounting hole 54 through which a fastener 36 is configured to pass when the fastener 36 is secured to the mounting boss 18 that is also coaxial with the central mounting hole 38. The shouldered bushing 56 is attached to opposite sides of the lower lip 48 by thin, generally rectangular webbing 58. The shouldered bushing 56 and webbing 58 are integrally formed with the shock absorbing device 40 and are formed of the same material.

The shock absorbing device 40 further includes a perforated disk 60 that is tethered to the shock absorbing device 40 by a flexible strand 62. The perforated disk 60 and the flexible strand 62 are integrally formed with the shock absorbing device 40 and are formed of the same material. The perforated disk 60 defines a mounting hole 54 through which a fastener 36 is configured to pass when the fastener 36 is secured to the mounting boss 18 of the housing 12. The mounting hole 54 of the perforated disk 60 is arranged to be coaxial with the mounting hole 54 of the shouldered bushing 56 and the central mounting hole 38 when the shock absorbing device 40 is secured to the mounting boss 18.

When the fastener 36 inserted though the perforated disk 60 and shouldered bushing 56 is secured to the mounting boss 18, the shoulder 66 of the shouldered bushing 56 is intermediate the lower surface 22 of the PCB 16 and the mounting boss 18 and the perforated disk 60 is intermediate the upper surface 24 of the PCB 16 and the head of the fastener 36. Tethering the perforated disk 60 and attaching the shouldered bushing 56 to the shock absorbing device 40 provides the benefit of simplifying the assembly process by reducing the number of separate parts required to assemble the electronic assembly 10.

Accordingly, an electronic assembly 10, such as a portable battery charger, is provided. The electronic assembly 10 includes a shock absorbing device 40 that surrounds the PCB 16 and isolates the PCB 16 from the housing 12 so that impact shock to the housing 12 caused by dropping the electronic assembly 10 is at least dampened, if not absorbed, by the shock absorbing device 40. An electronic assembly 10 having this shock absorbing device 40 has withstood a one meter drop onto a concrete surface without damage to the PCB 16.

While this invention has been described in terms of the preferred embodiments thereof, it is not intended to be so limited, but rather only to the extent set forth in the claims that follow. Moreover, the use of the terms first, second, upper, lower, etc. does not denote any order of importance or orientation, but rather the terms first, second, upper, lower, etc. are used to distinguish one element from another. Furthermore, the use of the terms a, an, etc. do not denote a limitation of quantity, but rather denote the presence of at least one of the referenced items.

We claim:

1. An electronic assembly, comprising:
a housing defining a mounting boss;
a printed circuit board (PCB) having a first major surface, a second major surface opposite said first major surface, and a plurality of peripheral minor edges substantially perpendicular to the first and second major surfaces, wherein the PCB defines a central mounting hole in a central portion of the PCB, said PCB disposed within said housing;
a shock absorbing device formed of an insulative compliant material surrounding the plurality of peripheral minor edges of the PCB;
a bushing defining a first mounting hole therethrough and defining a shoulder, said bushing attached to the shock absorbing device by a webbing and integrally formed with the shock absorbing device of the insulative compliant material, wherein the bushing is disposed within the central mounting hole;
a perforated disk defining a second mounting hole therethrough, coaxial with the first mounting hole, integrally formed with the shock absorbing device of the insulative compliant material;
a fastener inserted through the first and second mounting hole and engaging the mounting boss such that the insulative compliant material of the shoulder is in contact with the first surface and intermediate the first surface and the mounting boss and such that the insulative compliant material of the perforated disk is in contact with the second surface and is intermediate the second surface and a head of the fastener, and
wherein the shock absorbing device further includes a flexible strand connecting the perforated disk to the shock absorbing device and integrally formed with the shock absorbing device of the insulative compliant material and wherein the flexible strand is folded to align the second mounting hole of the perforated disk with the first mounting hole of the bushing.

2. The electronic assembly according to claim 1, wherein the shock absorbing device defines a groove configured to receive and enclose at least a portion of the plurality of peripheral minor edges of the PCB.

3. The electronic assembly according to claim 1, wherein the PCB defines a generally rectangular shape and wherein the shock absorbing device defines a groove configured to receive and enclose at least a portion of the plurality of peripheral minor edges of the PCB.

4. The electronic assembly according to claim 1, wherein the shock absorbing device defines a side wall configured to surround at least a portion of the plurality of peripheral minor edges of the PCB, a first lip substantially perpendicular to the side wall and configured to surround at least a portion of the first major surface, and a second lip substantially perpendicular to the side wall and configured to surround at least a portion of the second major surface.

5. The electronic assembly according to claim 4, wherein the first lip and the second lip define a groove configured to receive and enclose at least the portion of the first major surface and the second major surface.

6. The electronic assembly according to claim 1, wherein the shock absorbing device is formed of a thermoplastic elastomer material.

7. The electronic assembly according to claim 6, wherein the shock absorbing device is formed of a thermoplastic vulcanizates material.

\* \* \* \* \*